United States Patent
Dong

(10) Patent No.: US 10,381,591 B2
(45) Date of Patent: Aug. 13, 2019

(54) ORGANIC LIGHT EMITTING DIODE DEVICE WITH A PHOTOINDUCED ELECTRON FILM LAYER AND METHOD FOR MANUFACTURING THE SAME

(71) Applicant: BOE TECHNOLOGY GROUP CO., LTD., Beijing (CN)

(72) Inventor: Tian Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 15/544,951

(22) PCT Filed: Feb. 22, 2017

(86) PCT No.: PCT/CN2017/074347
§ 371 (c)(1),
(2) Date: Jul. 20, 2017

(87) PCT Pub. No.: WO2017/202082
PCT Pub. Date: Nov. 30, 2017

(65) Prior Publication Data
US 2018/0219173 A1    Aug. 2, 2018

(30) Foreign Application Priority Data

May 26, 2016 (CN) .......................... 2016 1 0362263

(51) Int. Cl.
*H01L 27/32* (2006.01)
*H01L 51/52* (2006.01)
(Continued)

(52) U.S. Cl.
CPC ...... *H01L 51/5221* (2013.01); *H01L 27/3244* (2013.01); *H01L 51/0021* (2013.01);
(Continued)

(58) Field of Classification Search
CPC ..... H01L 27/32; H01L 27/3209; H01L 51/50; H01L 51/5221
See application file for complete search history.

(56) References Cited

U.S. PATENT DOCUMENTS

2018/0114916 A1*   4/2018   Hayashi ................ C07C 255/51

FOREIGN PATENT DOCUMENTS

| CN | 1589077 A | 3/2005 |
|---|---|---|
| CN | 1599529 A | 3/2005 |

(Continued)

OTHER PUBLICATIONS

Third Office Action for Chinese Patent Application No. 201610362263.6 dated Feb. 13, 2018.
(Continued)

*Primary Examiner* — Hoai V Pham
(74) *Attorney, Agent, or Firm* — Calfee, Halter & Griswold LLP

(57) ABSTRACT

The present disclosure provides an OLED device and a method for manufacturing the same, an array substrate and a display device. The OLED device includes an anode and a cathode and a light emitting functional layer interposed between the anode and the cathode, wherein a photoinduced electron film layer is formed on a side of the cathode away from the light emitting functional layer, the photoinduced electron film layer is able to generate photoinduced electrons, and the photoinduced electrons are transferable from the photoinduced electron film layer to the cathode.

16 Claims, 2 Drawing Sheets

(51) Int. Cl.
*H01L 51/56* (2006.01)
*H01L 51/00* (2006.01)
(52) U.S. Cl.
CPC ...... *H01L 51/5234* (2013.01); *H01L 51/5253* (2013.01); *H01L 51/56* (2013.01); *H01L 2251/305* (2013.01)

(56) References Cited

FOREIGN PATENT DOCUMENTS

| CN | 101409330 A | 4/2009 |
|---|---|---|
| CN | 102956830 A | 3/2013 |
| CN | 103915568 A | 7/2014 |
| CN | 104124338 A | 10/2014 |
| CN | 104124342 A | 10/2014 |
| CN | 104347811 A | 2/2015 |
| CN | 104576703 A | 4/2015 |
| CN | 104638153 A | 5/2015 |
| CN | 105977397 A | 9/2016 |

OTHER PUBLICATIONS

Chinese First Office Action to corresponding Chinese Patent Application No. 201610362263.6 dated Jun. 2, 2017, 17 pages.
Chinese Second Office Action to corresponding Chinese Patent Application No. 201610362263.6 dated Nov. 16, 2017, 16 pages.
International Search Report to corresponding PCT Patent Application No. PCT/CN2017/074347, dated May 5, 2017, 8 pages.

* cited by examiner

ORGANIC LIGHT EMITTING DIODE DEVICE WITH A PHOTOINDUCED ELECTRON FILM LAYER AND METHOD FOR MANUFACTURING THE SAME

CROSS REFERENCE

The present application is based upon International Application No. PCT/CN2017/074347, filed on Feb. 22, 2017, which is based upon and claims priority to Chinese Patent Application No. 201610362263.6, filed on May 26, 2016, and the entire contents thereof are incorporated herein by reference.

TECHNICAL FIELD

The present disclosure relates to the field of display technology, in particular, to an organic light emitting diode (OLED) device and a method for manufacturing the same, an array substrate, and a display device.

BACKGROUND

When a portable mobile display device is used in an outdoor environment, it is necessary to increase the brightness of the display screen to recognize the image displayed in the display screen due to strong external light intensity.

An organic light emitting diode (OLED) display panel may achieve the purpose of increasing brightness by increasing the driving current of the pixel. When the current increases, the voltage drop at the cathode will be greatly increased, resulting in lower display uniformity of the display panel.

It should be noted that, information disclosed in the above background portion is provided only for better understanding of the background of the present disclosure, and thus it may contain information that does not form the prior art known by those ordinary skilled in the art.

SUMMARY

The present disclosure provides an organic light emitting diode (OLED) device and a method for manufacturing the same, an array substrate, and a display device.

The technical solutions of the present disclosure are as follows.

An organic light emitting diode (OLED) device includes an anode and a cathode and a light emitting functional layer interposed between the anode and the cathode, wherein a photoinduced electron film layer is formed on a side of the cathode away from the light emitting functional layer, the photoinduced electron film layer is able to generate photoinduced electrons, and the photoinduced electrons are transferable from the photoinduced electron film layer to the cathode.

The present disclosure further provides a method for manufacturing an OLED device including: forming an anode; forming a light emitting functional layer; forming a cathode; and forming a photoinduced electron film layer on a side of the cathode away from the light emitting functional layer, wherein the photoinduced electron film layer is able to generate photoinduced electrons, and the photoinduced electrons are transferable from the photoinduced electron film layer to the cathode.

The present disclosure further provides an array substrate including the above OLED device.

The present disclosure further provides a display device including the above array substrate.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

REFERENCE NUMERALS

100. Substrate; 2. Anode; 3. Light Emitting Functional Layer; 4. Cathode; 41. First Cathode Layer; 42. Second Cathode Layer; 5. Photoinduced Electron Film Layer; 6. Encapsulating Layer.

DETAILED DESCRIPTION

The present disclosure will be described in further detail with reference to the accompanying drawings and particular embodiments, such that those skilled in the art may have a better understanding of technical solutions of the present disclosure.

The First Embodiment

Figure 1:
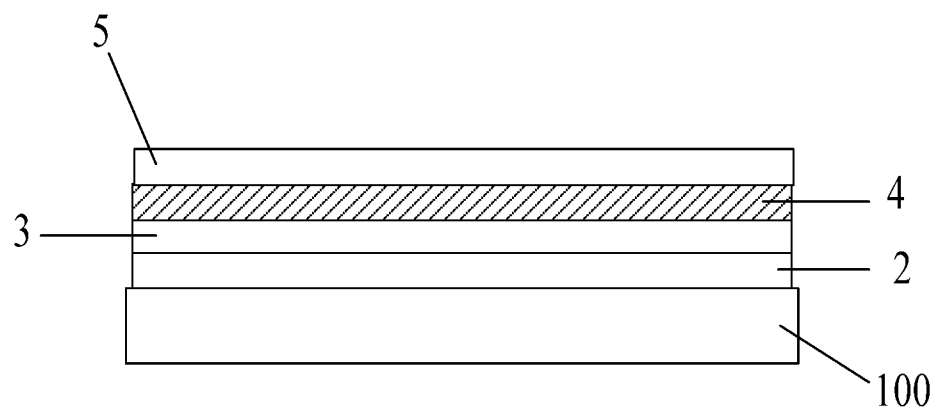
FIG. 1 is a structural schematic diagram of an OLED device according to the first embodiment of the present disclosure.

The present embodiment provides an OLED device, as illustrated in FIG. 1, the OLED device includes an anode 2 and a cathode 4 formed on a substrate 100, and a light emitting functional layer 3 interposed between the anode 2 and the cathode 4. A photoinduced electron film layer 5 is formed on a side of the cathode 4 away from the light emitting functional layer 3. The photoinduced electron film layer 5 may produce photoinduced electrons, which may be transferred into the cathode 4 through the photoinduced electron film layer.

In the present embodiment of the present disclosure, the OLED device may be a top emitting type OLED, or may be a bottom emitting type OLED, or may be a dual emitting type OLED, which is not limited thereto. In the OLED device according to the present embodiment, the photoinduced electron film layer 5 is provided on the side of the cathode 4 away from the light emitting functional layer 3. Photoinduced electrons may be generated in the photoinduced electron film layer 5 when being exposed to strong light, and the photoinduced electrons may be transferred into the cathode 4 from a side of the photoinduced electron film layer 5, thereby reducing the resistance of the cathode 4 and reducing the voltage drop at the cathode 4, which in turn may improve display uniformity of the display panel. The OLED device according to the present disclosure is applicable to various display devices, and particularly to the display devices for long-term outdoor use.

The Second Embodiment

Figure 2:
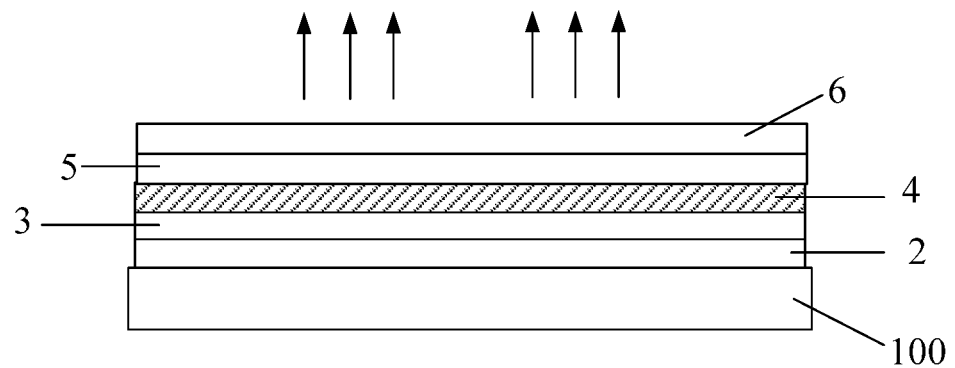
FIG. 2 is a structural schematic diagram of an OLED device according to the second embodiment of the present disclosure.

The present embodiment provides a top emitting OLED device, as illustrated in FIG. 2, the OLED device includes an anode 2 and a cathode 4 formed on a substrate 100, and a light emitting functional layer 3 interposed between the anode 2 and the cathode 4. A photoinduced electron film layer 5 is formed on a side of the cathode 4 away from the light emitting functional layer 3. The work function of the photoinduced electron film layer 5 may be smaller than that of the cathode 4. An encapsulating layer 6 is provided at a side of the photoinduced electron film layer 5 away from the cathode 4.

In particular, the light emitting functional layer 3 includes a hole injection layer (HIL), a hole transport layer (HTL), an emitting material layer (EML), an electron transport layer (ETL), and an electron injection layer (EIL).

When the OLED device according to the present embodiment is used outdoor in an strong light environment, photoinduced electrons may be generated in the photoinduced electron film layer 5, and the photoinduced electrons may be transferred into the cathode 4 from a side of the photoinduced electron film layer 5 due to the work function difference between the photoinduced electron film layer 5 and the cathode 4. Accordingly, the resistance of the cathode 4 may be reduced and the voltage drop at the cathode 4 may be reduced, which may in turn improve display uniformity of the display panel. It should be noted that the greater the work function difference between the photoinduced electron film layer 5 and the cathode 4 is, the more the resistance of the cathode 4 decreases, and the better the display uniformity of the display panel becomes.

Preferably, the photoinduced electron film layer 5 is formed of cadmium sulfide (CdS).

In the present embodiment, the photoinduced electron film layer 5 includes a semiconductor material having good response to natural light, and CdS material having strong photoelectric effect with respect to visible light is used in the present embodiment. It should be appreciated that other similar materials such as indium antimonide (InSb), (gold (Au), mercury (Hg)) doped germanium (Ge), tellurium tin lead (TeSnPb), telluride mercury cadmium (TeCdHg) or the like are also possible.

Preferably, a thickness of the photoinduced electron film layer 5 is 10-200 nm.

In other words, the thickness of the photoinduced electron film layer 5 shall not be too thick, and if the photoinduced electron film layer 5 is too thick, the material cost thereof may be increased and the light transparency may be reduced. On the other hand, if the photoinduced electron film layer 5 is too thin, the photoelectric effect thereof may be reduced and thus the contribution of reducing the power consumption of the OLED may be reduced.

Optionally, the work function of the cathode 4 is greater than 4.0 eV.

In other words, the cathode 4 is formed of a transparent conductive material with a high work function. In particular, when the photoinduced electron film layer 5 if formed of CdS, the cathode 4 may have a work function greater than 4.0 eV since the work function of the CdS is about 4.0 eV. Furthermore, the greater the work function of the cathode 4 is, the more the resistance of the cathode 4 reduces when exposed to strong light, and the better the display uniformity of the display panel becomes.

The Third Embodiment

Figure 3:
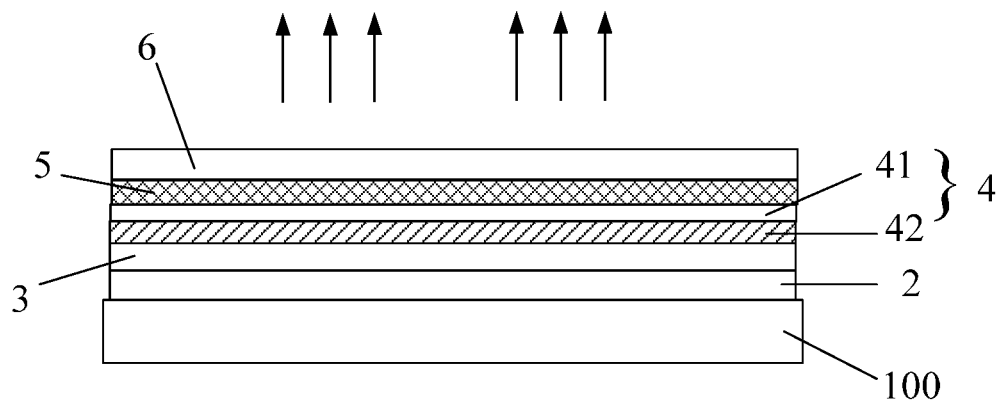
FIG. 3 is a structural schematic diagram of an OLED device according to the third embodiment of the present disclosure.

The present embodiment provides a top emitting OLED device, as illustrated in FIG. 3, the OLED device includes an anode 2 and a cathode 4 formed on a substrate 100, and a light emitting functional layer 3 interposed between the anode 2 and the cathode 4. A photoinduced electron film layer 5 is formed on a side of the cathode 4 away from the light emitting functional layer 3, and an encapsulating layer 6 is formed on a side of the photoinduced electron film layer 5 away from the cathode 4. In the present embodiment, the cathode 4 includes a first cathode layer 41 and a second cathode layer 42 arranged adjacently. The first cathode layer 41 is adjacent to the photoinduced electron film layer 5, and a work function of the photoinduced electron film layer 5 is smaller than that of the first cathode layer 41.

In other words, the present embodiment provides an implementation having a composite cathode 4. The composite cathode 4 includes two layers. The second cathode layer 42 is in contact with the light emitting functional layer 3, and the first cathode layer 41 is in contact with the photoinduced electron film layer 5. In the present embodiment, the work function of the photoinduced electron film layer 5 is smaller than that of the first cathode layer 41. In this way, while being exposed to an outdoor strong light environment, photoinduced electrons may be transferred into the first cathode layer 41 from a side of the photoinduced electron film layer 5. The second cathode layer 42 may be formed of an alloy of Mg/Ag. Since the first electrode layer 41 and the second electrode layer 42 are disposed adjacently, and the second electrode layer 42 is formed of a conductive material, the resistance of the composite cathode 4 may be reduced and the voltage drop at the composite cathode 4 may be reduce, and thus display uniformity of the display panel may be improved.

Preferably, the first cathode layer 41 is formed of indium zinc oxide (IZO).

Preferably, the first cathode layer 41 has a thickness of 10-100 nm.

In other words, preferably, the first cathode layer 41 in the composite cathode 4 is formed of a transparent material such as IZO. In addition, light transmittance will not be affected when the first cathode layer 41 has a thickness of 10-100 nm.

The OLED device according to the present disclosure is applicable to various display devices, and particularly to the display devices for long-term outdoor use.

The Fourth Embodiment

Figure 4:
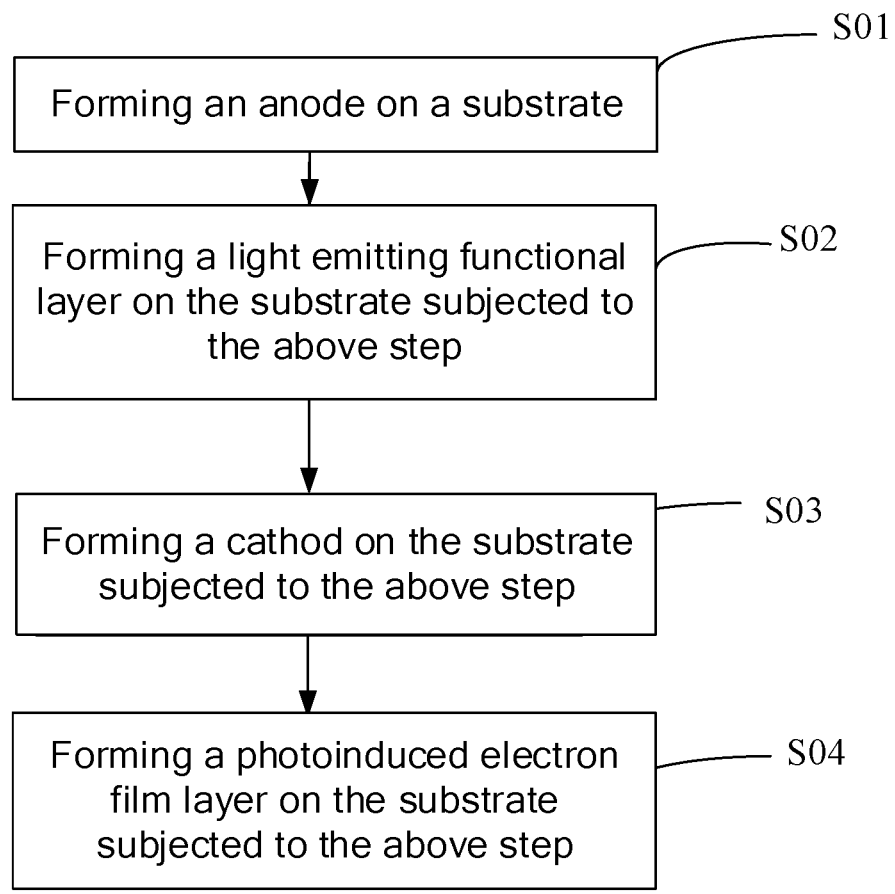
FIG. 4 is a flow chart of manufacturing an OLED device according to the fourth embodiment of the present disclosure.

The present embodiment provides a method for manufacturing an OLED device, and as illustrated in FIG. 4, the method includes the steps that follow.

In step S01, an anode conductive thin film is sputtered on a substrate, and a pattern including an anode is formed by a patterning process.

In the embodiment, the substrate supports the electrode layers and the organic light emitting functional layer film in the OLED device, and may have a good light transmission performance in the visible light region and certain ability of moisture and oxygen permeation resistance. Also, the substrate may have a good surface smoothness. Generally, the substrate may be made of glass, flexible sheets, array substrate, or the like. In the case of using the flexible sheet, the substrate may be formed of polyester based material, polyimide or thin metal.

As the connection layer of the forward voltage of the OLED device, the anode has good electrical conductivity, light transmittance of the visible light region and a high work function. The anode is usually formed of inorganic metal oxides such as ITO, ZnO or the like, organic conductive polymers such as poly-3,4-ethylenedioxythiophene/ polystyrenesulfonate (PEDOT:PSS), polyaniline (PANT), or the like, or high work function materials such as Au, Cu, Ag, Pt, or the like. The anode has a thickness of 10-200 nm.

In step S02, a light emitting functional layer is prepared by a vacuum evaporation process on the substrate subjected to the above step.

In the present embodiment, the light emitting functional layer may include three or five layers of vacuum evaporated organic films. In particular, the light emitting functional layer may include an HIL, an HTL, an EML, an ETL and an EIL.

The HIL may include any one of 2,3,6,7,10,11-hexacyano-1,4,5,8,9,12-hexaazatriphenyl ene (HAT-CN), 2,3,5,6-tetrafluoro-7,7',8,8'-tetracyanoquinodimethane ($F_4$-TCNQ), and tris(4-bromophenyl)aminium hexachloroantimonate (TBAHA). The HIL may have a thickness of 1-5 nm.

The HTL may be formed of a material having a hole mobility of more than $10^{-5}$ cm$^2$/V·S. The HTL may be formed of an aromatic diamine compound, a triphenylamine compound, an aromatic triamine compound, a biphenylenediamine derivative, a triarylamine Polymers, metal complexes, or carbazole polymers. The HTL has a thickness of 10-200 nm.

The EML may be formed of an undoped fluorescent organic material having a light-emitting material with a hole-transporting capacity not lower than its electron-transporting ability, or a fluorescent material doped organic material composed of a fluorescent dopant and a base material, or a phosphorescent material doped organic material composed of a phosphorescent dopant and a base material. The EML has a thickness of 10-50 nm.

The ETL is formed of any one of 2-(4-biphenylyl)-5-phenyl oxadiazole (PBD), 2,5-bis (1-naphthyl)-1,3,5-oxadiazole (BND), and 2,4,6-triphenoxy-1,3,5-triazine (TRZ).

The EIL is formed of any one of lithium fluoride, sodium fluoride, potassium fluoride, rubidium fluoride, cesium fluoride, lithium oxide and lithium metaborate. The EIL has a thickness of 1-5 nm.

In step S03, a cathode is formed by a vacuum evaporation process on the substrate subjected to the above step.

In the embodiment, the cathode may include one layer of vacuum evaporated material with a high work function, or may be a composite cathode including multiple layers, or may be formed of a doped material, as long as the cathode has a work function greater than that of the photoinduced electron film layer. In particular, a layer of Mg/Ag alloy material may be vacuum evaporated as a second cathode layer on the light emitting functional layer, and then a layer of IZO having a thickness of 10-100 nm as a first cathode layer may be formed on the second cathode layer.

In step S04, a photoinduced electron film layer is formed on the substrate subjected to the above step. In the embodiment, the photoinduced electron film layer may generate photoinduced electrons. The photoinduced electrons may be transferred into the cathode from the photoinduced electron film layer.

In particular, in the step of forming the photoinduced electron film layer, the photoinduced electron film layer may be formed by sputtering or deposition. More particular, the formed photoinduced electron film layer may include a layer of sputtered or deposited CdS having a thickness of 10-200 nm.

In step S05, an encapsulating layer is formed on the substrate subjected to the above step, such that the air inside the OLED may be exhausted, and penetration of external oxygen and moisture may be prevented.

Obviously, the specific implementations of the embodiments described above may also be varied in a number of ways; for example, the specific process parameters such as the specific material, thickness and the like of each film layer of the OLED device may be adjusted according to the product requirements.

The Fifth Embodiment

The present embodiment provides an array substrate including the OLED devices according the above embodiments.

The Sixth Embodiment

The present embodiment provides a display device including the array substrate according to the above embodiment. The display device may be any product or part having a display function such as an electronic paper, an OLED panel, a mobile phone, a tablet computer, a TV set, a monitor, a notebook computer, a digital photo album, a navigator and the like.

In the OLED device according to the present disclosure, a photoinduced electron film layer is formed on a side of the cathode away from the light emitting functional layer. When being exposed to strong light, the photoinduced electron film layer may generate photoinduced electrons which may be transferred to the cathode from a side of the photoinduced electron film layer, thereby lowering the resistance and the voltage drop of the cathode, and improving display uniformity of the display panel. The OLED device according to the present disclosure is applicable to various display devices, and particularly to the display devices for long-term outdoor use.

It should be appreciated that, the above embodiments are exemplary implementations for illustrating the principle of the present disclosure only, while the present disclosure is not limited thereto. Various modifications and improvements are possible to those of ordinary skill in the art without departing from the spirit and essence of the present disclosure. All these modifications and improvements will also be regarded as the protection scope of the present disclosure.

What is claimed is:

1. An organic light emitting diode (OLED) device comprising:
   an anode;
   a cathode; and
   a light emitting functional layer interposed between the anode and the cathode,
   a photoinduced electron film layer is formed on a side of the cathode away from the light emitting functional layer,
   wherein the photoinduced electron film layer is able to generate photoinduced electrons,
   wherein the photoinduced electrons are transferable from the photoinduced electron film layer to the cathode, wherein the cathode comprises a first cathode layer and a second cathode layer adjacent to each other, wherein the first cathode layer is close to the photoinduced electron film layer, and the photoinduced electron film layer has work function smaller than that of the first cathode layer and wherein the first cathode layer is formed of IZO.

2. The OLED device according to claim 1, wherein the photoinduced electron film layer has a work function smaller than that of the cathode.

3. The OLED device according to claim 2, wherein the photoinduced electron film layer is formed of CdS.

4. The OLED device according to claim 2, wherein the photoinduced electron film layer is formed of any one of indium antimonide (InSb), gold (Au) doped germanium (Ge), mercury (Hg) doped germanium (Ge), tellurium tin lead (TeSnPb), telluride mercury cadmium (TeCdHg).

5. The OLED device according to claim 1, wherein the photoinduced electron film layer has a thickness of 10-200 nm.

6. The OLED device according to claim 5, wherein the photoinduced electron film layer is formed of CdS.

7. The OLED device according to claim 5, wherein the photoinduced electron film layer is formed of any one of indium antimonide (InSb), gold (Au) doped germanium (Ge), mercury (Hg) doped germanium (Ge), tellurium tin lead (TeSnPb), telluride mercury cadmium (TeCdHg).

8. The OLED device according to claim 1, wherein the photoinduced electron film layer is formed of CdS.

9. The OLED device according to claim 8, wherein the cathode has a work function greater than 4.0 eV.

10. The OLED device according to claim 1, wherein the photoinduced electron film layer is formed of any one of indium antimonide (InSb), gold (Au) doped germanium (Ge), mercury (Hg) doped germanium (Ge), tellurium tin lead (TeSnPb), telluride mercury cadmium (TeCdHg).

11. The OLED device according to claim 1, wherein the first cathode layer has a thickness of 10-100 nm.

12. The OLED device according to claim 1, wherein the second cathode layer is formed of an alloy material of Mg/Ag.

13. The OLED device according to claim 1, wherein the OLED device is a top emitting type OLED device, and an encapsulating layer is formed on a side of the photoinduced electron film layer away from the cathode.

14. An array substrate comprising the OLED device according to claim 1.

15. A display device comprising the array substrate according to claim 14.

16. A method for manufacturing an OLED device comprising:
   forming a substrate;
   forming an anode on the substrate;
   forming a light emitting functional layer on the substrate on which the anode is formed;
   forming a cathode on the substrate on which the anode and the light emitting functional layer are formed; and
   forming a photoinduced electron film layer on a side of the cathode away from the light emitting functional layer,
   wherein the photoinduced electron film layer is able to generate photoinduced electrons, and the photoinduced electrons are transferable from the photoinduced electron film layer to the cathode, wherein the cathode comprises a first cathode layer and a second cathode layer adjacent to each other, wherein the first cathode layer is close to the photoinduced electron film layer, and the photoinduced electron film layer has a work function smaller than that of the first cathode layer and wherein the first cathode layer is formed of IZO.

* * * * *